United States Patent
Kirigaya

(10) Patent No.: US 7,375,974 B2
(45) Date of Patent: May 20, 2008

(54) ELECTRONIC DEVICE

(75) Inventor: Masato Kirigaya, Oobu (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/073,621

(22) Filed: Mar. 8, 2005

(65) Prior Publication Data

US 2005/0201069 A1    Sep. 15, 2005

(30) Foreign Application Priority Data

Mar. 15, 2004   (JP) ................ 2004-073117

(51) Int. Cl.
*H05K 7/02*   (2006.01)
(52) U.S. Cl. ............... 361/752; 361/807; 361/720; 361/767; 174/520
(58) Field of Classification Search ........ 361/719–721, 361/702, 704, 707, 752, 807, 767, 760; 174/520, 174/521
See application file for complete search history.

(56) References Cited

U.S. PATENT DOCUMENTS

| | | | | |
|---|---|---|---|---|
| 5,359,496 A | * | 10/1994 | Kornrumpf et al. ........ | 361/795 |
| 5,576,934 A | * | 11/1996 | Roethlingshoefer et al. ............ | 361/761 |
| 5,973,923 A | * | 10/1999 | Jitaru ................. | 361/704 |
| 6,057,593 A | * | 5/2000 | Iovdalsky et al. ......... | 257/659 |
| 6,180,880 B1 | * | 1/2001 | Loibl et al. ............ | 174/52.3 |
| 6,222,733 B1 | * | 4/2001 | Gammenthaler ........ | 361/705 |
| 6,245,442 B1 | * | 6/2001 | Towata et al. .......... | 428/614 |
| 6,356,448 B1 | * | 3/2002 | DiBene et al. ......... | 361/721 |
| 6,807,061 B1 | * | 10/2004 | Harris ............... | 361/719 |
| 6,862,186 B2 | * | 3/2005 | Belady et al. ......... | 361/721 |
| 6,873,530 B2 | * | 3/2005 | Belady et al. ......... | 361/719 |
| 6,900,987 B2 | * | 5/2005 | Belady et al. ......... | 361/719 |
| 6,947,286 B2 | * | 9/2005 | Belady et al. ......... | 361/719 |
| 6,970,358 B2 | * | 11/2005 | Harris ............... | 361/719 |
| 2003/0148070 A1 | | 8/2003 | Goebel et al. | |

FOREIGN PATENT DOCUMENTS

| | | |
|---|---|---|
| JP | 10-75075 | 3/1998 |
| JP | 2001-516972 | 10/2001 |

\* cited by examiner

*Primary Examiner*—Diego Gutierrez
*Assistant Examiner*—Dameon E Levi
(74) *Attorney, Agent, or Firm*—Posz Law Group, PLC

(57) ABSTRACT

A circuit board is disposed on a support plate, with electronic components mounted on this circuit board being accommodated in recessed portions of the support plate. Thermal adhesive members intervene between rear surfaces of the electronic components and bottom surfaces of the recessed portions of the support plate. The support plate has degassing grooves. Furthermore, the support plate has raised portions provided on its upper surface for supporting the circuit board in a floated condition with a gap between them.

10 Claims, 16 Drawing Sheets

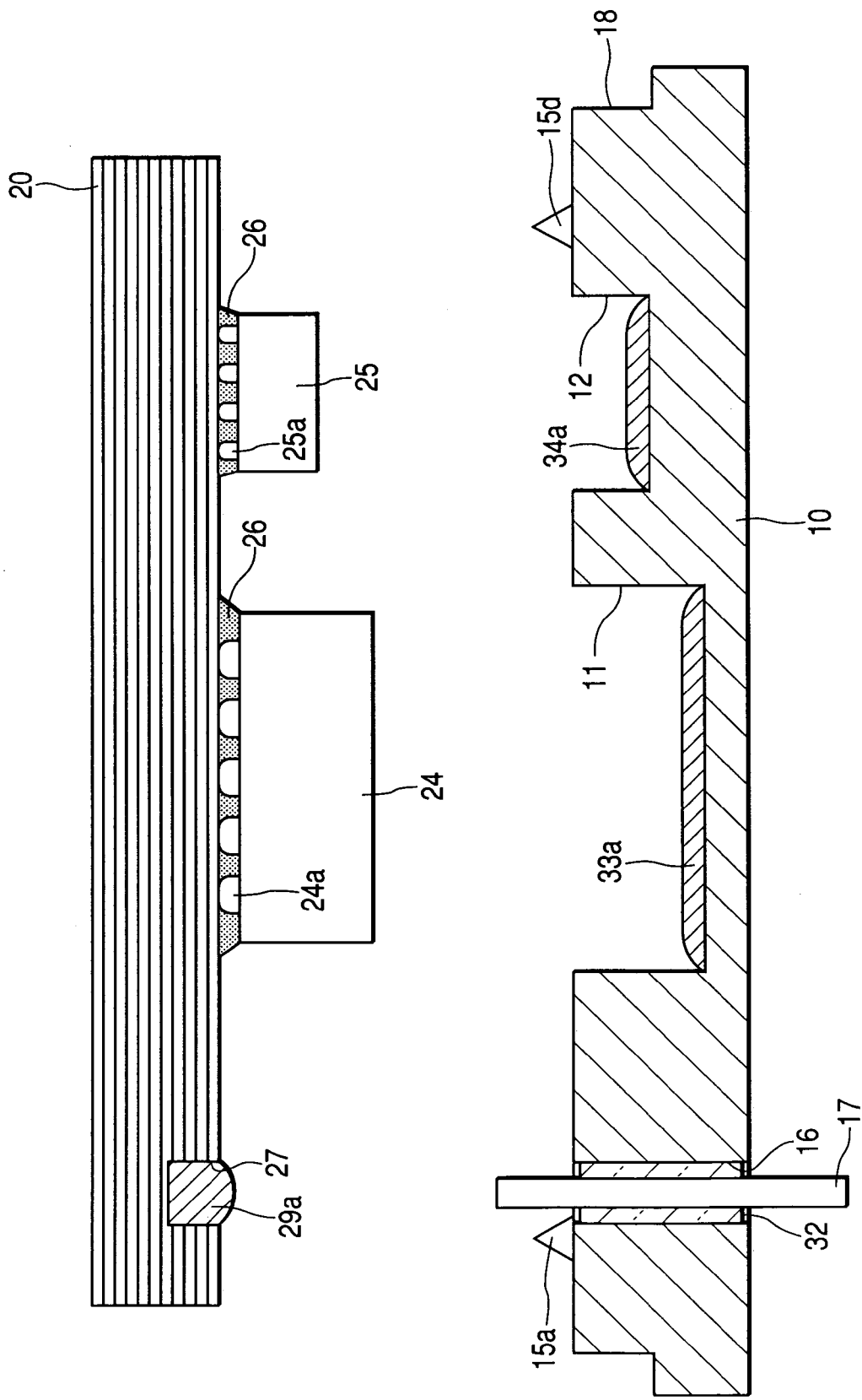

ELECTRONIC DEVICE

CROSS-REFERENCE TO RELATED APPLICATION

This application is based upon and claims the benefit of priority from earlier Japanese Patent Application No. 2004-73117 filed on Mar. 15, 2004 so that the descriptions of which are incorporated herein by reference.

BACKGROUND OF THE INVENTION

The present invention relates to an electronic device, and more particularly to an electronic device having an excellent heat radiation structure.

As a conventional heat radiation structure for an electronic device, the U.S. Pat. application publication No. 2003/0148070A1 discloses a circuit board mounting an electronic component and disposed on a support plate. According to this prior art document, the ceramic body arranging the support plate is a porous member whose cavities are filled with aluminum. Furthermore, both surfaces of this ceramic body are covered with a metallic coat. The electronic component mounted on the circuit board is accommodated in a recessed portion of the support plate covered with this metallic coat. Moreover, the electronic component is fixed to the recessed portion with a thermal conductivity adhesive material.

However, according to this conventional electronic device, the electronic component is accommodated via the thermal adhesive member in the recessed portion to transfer the heat of the electronic component to the support plate. In this case, there will be the possibility that the thermal adhesive member includes voids and the heat generated from the electronic component cannot be effectively released to the support plate. More specifically, the assembling of this electronic device includes a step of inserting the circuit board mounting the electronic component into the recessed portion of the support plate and a step of fixing the electronic component to the recessed portion with a thermal adhesive member. In these assembling processes, the gas generates from the thermal adhesive member and will stay in the recessed portion and accordingly the thermal adhesive member will contain a great amount of voids. These voids will make it difficult to effectively release the heat generating from the electronic component to the support plate.

SUMMARY OF THE INVENTION

In view of the above-described problems, the present invention has an object to provide an electronic device capable of eliminating or reducing the voids remaining in the thermal adhesive member and providing excellent heat radiation properties.

In order to accomplish the above and other related objects, the present invention provides a first electronic device including a circuit board disposed on a support plate, with at least one electronic component mounted on the circuit board being accommodated in a recessed portion of the support plate. A thermal adhesive member intervenes between a rear surface of the electronic component and a bottom surface of the recessed portion of the support plate. According to the first electronic device of the present invention, the support plate has a communicating passage having one end opened to an inner space of the recessed portion and the other end opened to an outside of a layout region of the circuit board. Accordingly, the gas generating in the recessed portion of the support plate can easily go out of the recessed portion via the communicating passage. Thus, the arrangement of the first electronic device of the present invention can reduce or eliminate undesirable voids remaining in the thermal adhesive member, and accordingly can bring excellent heat radiation properties.

Furthermore, the present invention provides a second electronic device including a circuit board disposed on a support plate, with at least one electronic component mounted on the circuit board being accommodated in a recessed portion of the support plate. A thermal adhesive member intervenes between a rear surface of the electronic component and a bottom surface of the recessed portion of the support plate. According to the second electronic device of the present invention, the support plate has raised portions on its surface opposing to the circuit board for supporting the circuit board in a floated condition with a gap corresponding to the raised portions between the support plate and the circuit board. Accordingly, the raised portions cooperatively form a degassing passage between the support plate and the circuit board. The gas generating in the recessed portion of the support plate can easily go out of the recessed portion via the degassing passage. Thus, the arrangement of the second electronic device of the present invention can reduce or eliminate undesirable voids remaining in the thermal adhesive member, and accordingly can bring excellent heat radiation properties Moreover, the present invention provides a third electronic device including a circuit board disposed on a support plate, with at least one electronic component mounted on the circuit board being accommodated in a recessed portion of the support plate. A thermal adhesive member intervenes between a rear surface of the electronic component and a bottom surface of the recessed portion of the support plate. According to the third electronic device of the present invention, the support plate has a communicating passage having one end opened to an inner space of the recessed portion and the other end opened to an outside of a layout region of the circuit board. Furthermore, the support plate has raised portions on its surface opposing to the circuit board for supporting the circuit board in a floated condition with a gap corresponding to the height of the raised portions between the support plate and the circuit board. Accordingly, the gas generating in the recessed portion of the support plate can easily go out of the recessed portion via the communicating passage. Furthermore, the raised portions cooperatively form a degassing passage between the support plate and the circuit board. The gas generating in the recessed portion of the support plate can easily go out of the recessed portion via the degassing passage. Thus, the arrangement of the third electronic device of the present invention can reduce or eliminate undesirable voids remaining in the thermal adhesive members, and accordingly brings excellent heat radiation properties.

According to the first or third electronic device of the present invention, it is preferable that the communicating passage is a groove formed on a surface of the support plate opposing to the circuit board. This arrangement is advantageous because of easiness in providing or forming the communicating passage.

Furthermore, according to the second or third electronic device of the present invention, it is preferable that the raised portions have a pyramid shape.

This arrangement is advantageous because there is no possibility that foreign particles or substances stay between the sharp pinnacles of respective raised portions and the circuit board. Accordingly, the circuit board can be accurately supported on the support plate in a floated condition with an accurate vertical gap corresponding to the height of these raised portions.

Furthermore, according to the first electronic device of the present invention, it is preferable that the support plate has a region bonded to the circuit board with resin-based adhesive interposed therebetween, and the other end of the communicating passage is opened to the outside of the region of the support plate bonded to the circuit board.

BRIEF DESCRIPTION OF THE DRAWINGS

The above and other objects, features and advantages of the present invention will become more apparent from the following detailed description which is to be read in conjunction with the accompanying drawings, in which:

FIG. 6 is a vertical cross-sectional view explaining a method of assembling the electronic device in accordance with the preferred embodiment of the present invention;

DESCRIPTION OF THE PREFERRED EMBODIMENTS

Preferred embodiments of the present invention will be explained hereinafter with reference to attached drawings.

Figure 1:
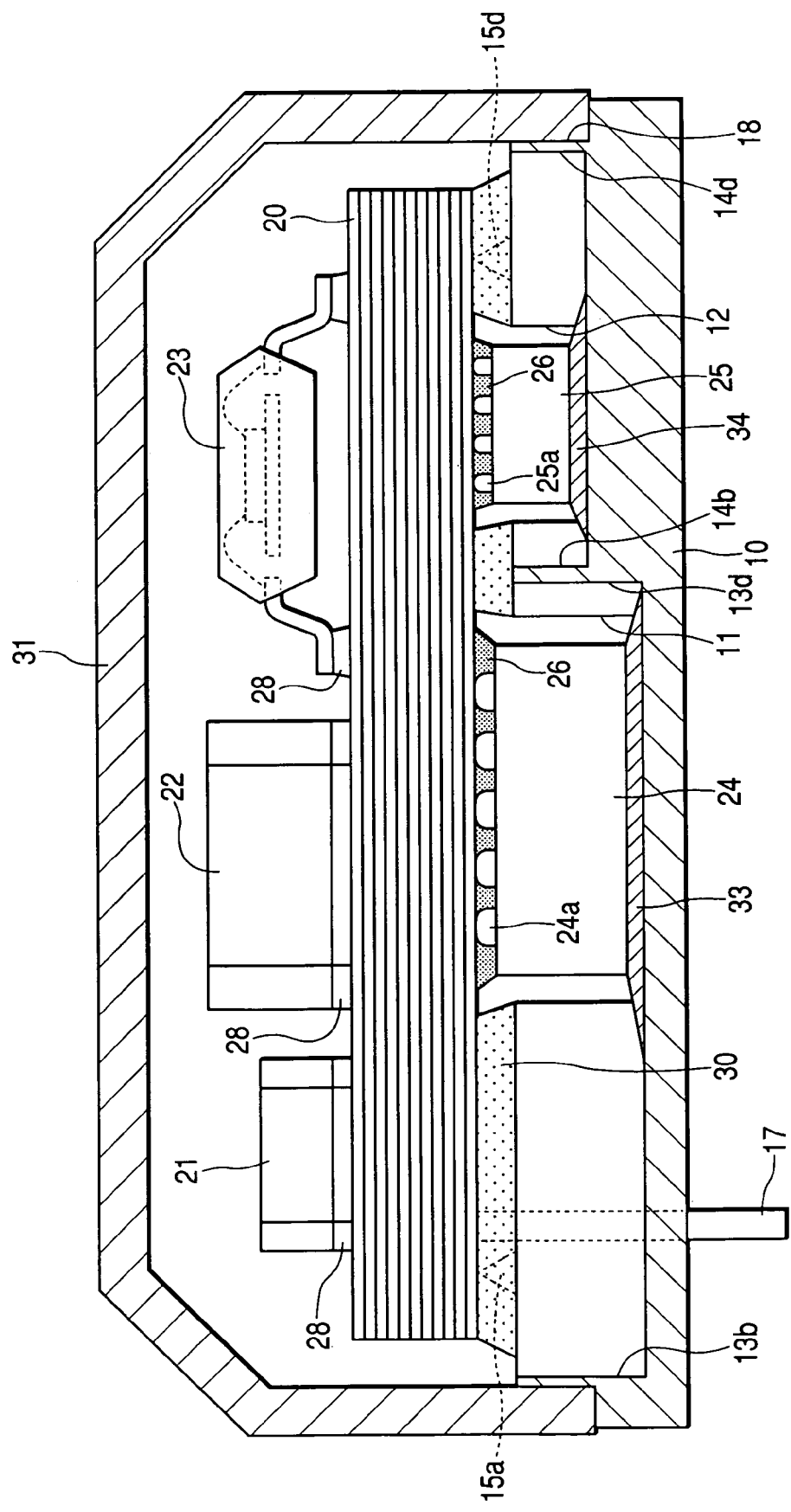
FIG. 1 is a vertical cross-sectional view showing an electronic device in accordance with a preferred embodiment of the present invention.
Figure 2:
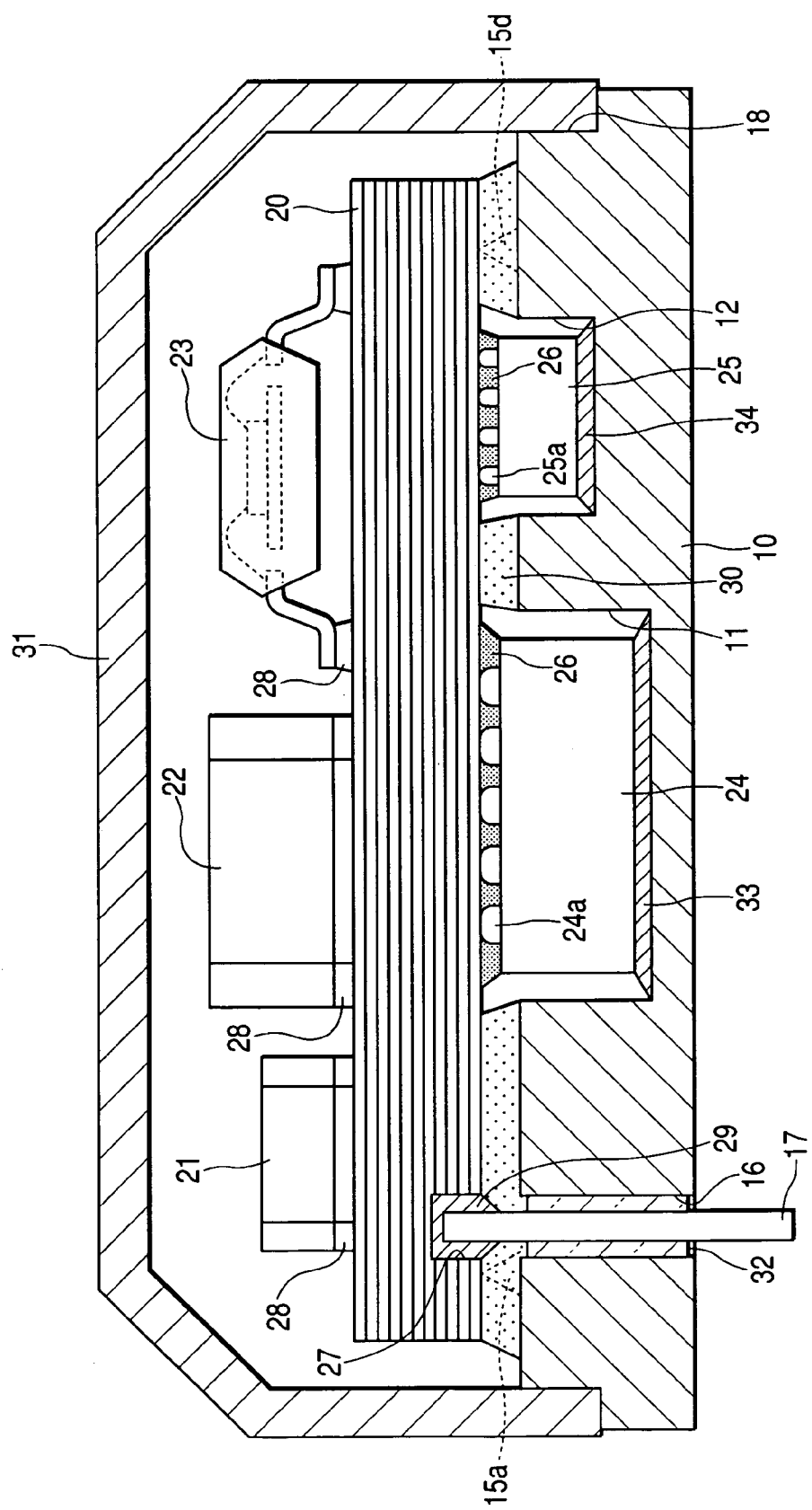
FIG. 2 is a vertical cross-sectional view showing the electronic device in accordance with the preferred embodiment of the present invention.
Figure 3:
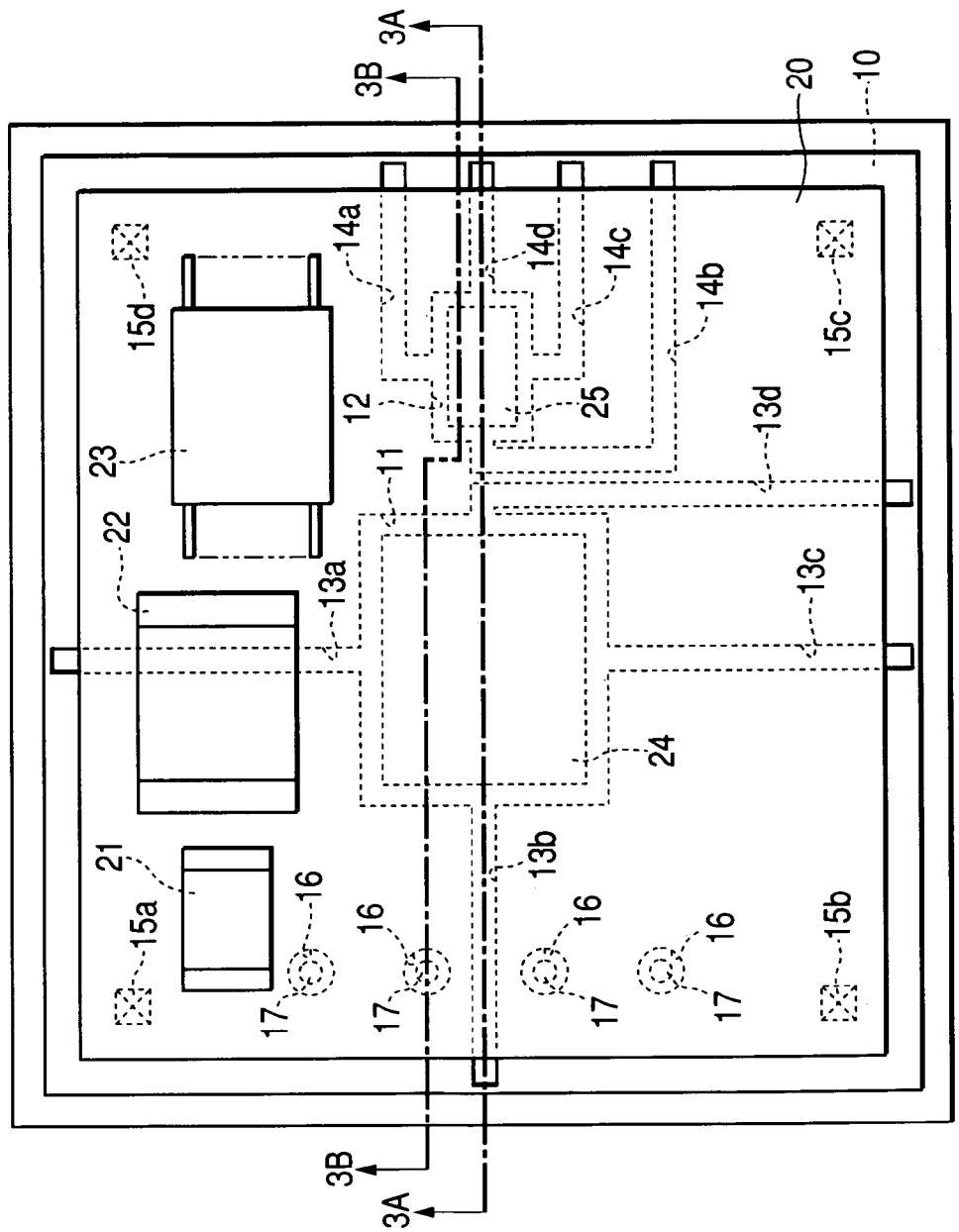
FIG. 3 is a plan view showing the electronic device in accordance with the preferred embodiment of the present invention.

Hereinafter, a preferred embodiment of the present invention will be explained with reference to attached drawings. FIGS. 1 and 2 are vertical cross-sectional views showing an electronic device in accordance with a preferred embodiment. As shown in FIGS. 1 and 2, a circuit board 20 mounting various electronic components is disposed on a support plate 10. The circuit board 20 is covered with a cover 31. FIG. 3 is a plan view showing the circuit board 20, although the cover 31 is removed. FIG. 1 is a vertical cross-sectional view taken along a line 3A-3A of FIG. 3. FIG. 2 is a vertical cross-sectional view taken along a line 3B-3B of FIG. 3. This electronic device is an electronic control unit (ECU) incorporated in an automatic transmission of an automotive vehicle, which is compact, heat resistive, and reliable.

Figure 4:
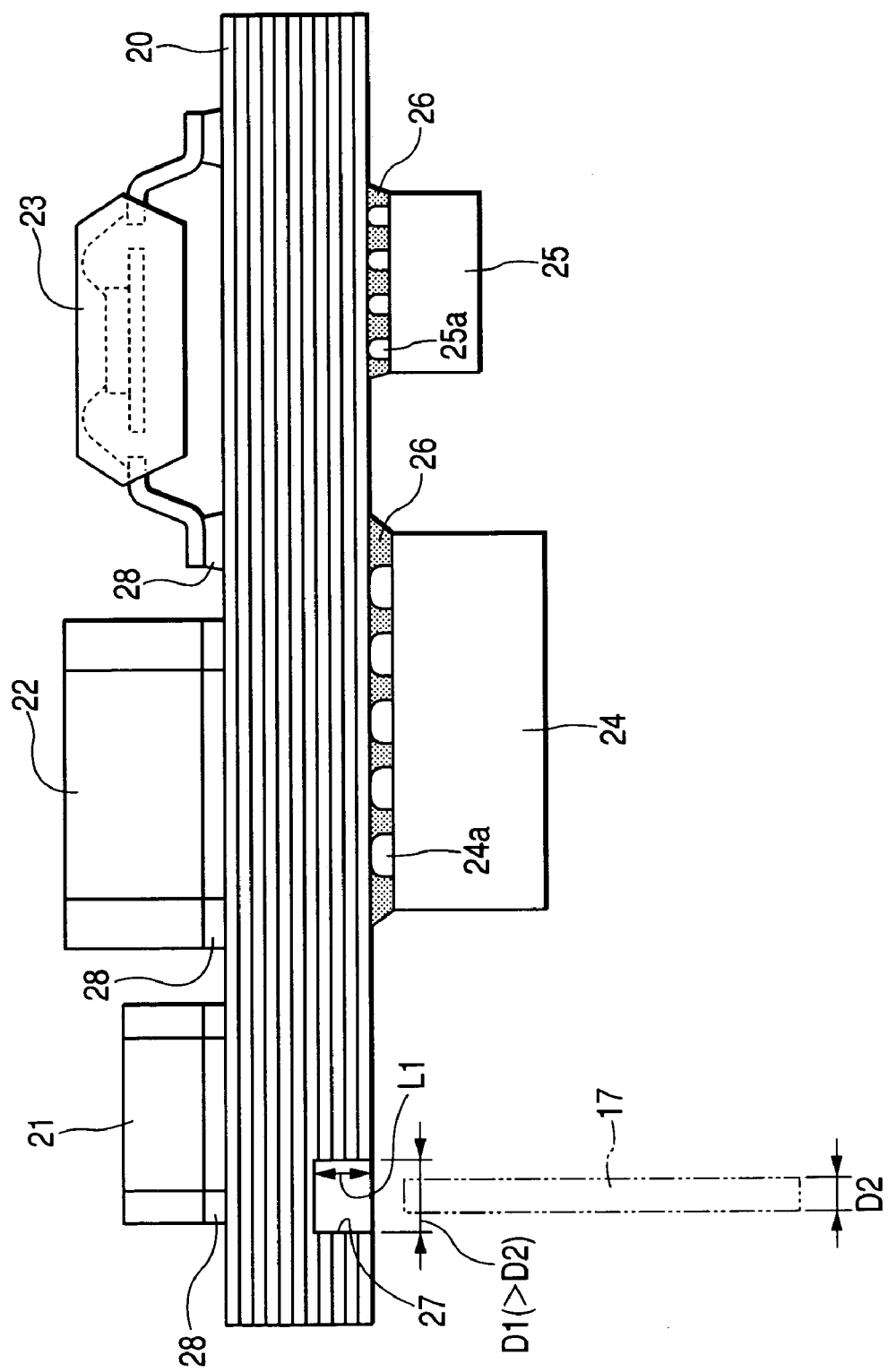
FIG. 4 is a vertical cross-sectional view showing a circuit board mounting electronic components in accordance with the preferred embodiment of the present invention.

FIG. 4 shows the circuit board 20 together with electronic components mounted on this circuit board 20. The circuit board 20 shown in FIG. 4 is a multilayered ceramic substrate which includes alumina as a base material. As shown in FIG. 3, electronic components 21, 22, and 23 are disposed on an upper surface of the circuit board (i.e. multilayered ceramic substrate) 20. As shown in FIG. 4, electrodes of these electronic components 21, 22, and 23 are bonded to the circuit board 20 with solders 28. As understood from FIG. 4, two electronic components 21 and 22 are laminate ceramic chip capacitors and another electronic component 23 is a molded component including a resin molded chip.

Furthermore, electronic components 24 and 25 are disposed on a lower surface (i.e. reverse surface) of the circuit board 20 as shown in FIG. 4. FIG. 3 shows, in a plan view, the positions of these electronic components 24 and 25 relative to the circuit board 20. More specifically, as understood from FIG. 3, the electronic component 24 is disposed at a central region of the circuit board 20. The electronic component 25 is disposed next to the right side of the electronic component 24. The electronic component 25 is an integrated circuit chip, and the electronic component 24 is highly integrated circuit chip. These electronic components 24 and 25 are mounted by flip chip on the circuit board 20. FIG. 4 shows solder bumps 24a via which the electronic component 24 is mounted on the circuit board 20. The electronic component 25 is mounted via gold bumps 25a on the circuit board 20. Furthermore, as shown in FIG. 4, an underfill member 26 interposes between the circuit board 20 and respective electronic components 24 and 25.

Furthermore, as shown in FIG. 4, the circuit board (i.e. multilayered ceramic substrate) 20 has at least one recessed portion 27 formed on the lower surface thereof. The recessed portion 27 can receive an upper end of a later-described external connecting terminal (pin) 17. The inner diameter D1 of the recessed portion 27 is sufficiently larger than the outer diameter D2 of the external connecting terminal 17

(i.e. D1>D2). The depth L1 of the recessed portion 27 is in the range from 0.1 mm to 0.4 mm. A total of four recessed portions 27 are arrayed in line as shown in FIG. 3. Accordingly, four external connecting terminals 17 can be inserted into the recessed portions 27.

Figure 5A:
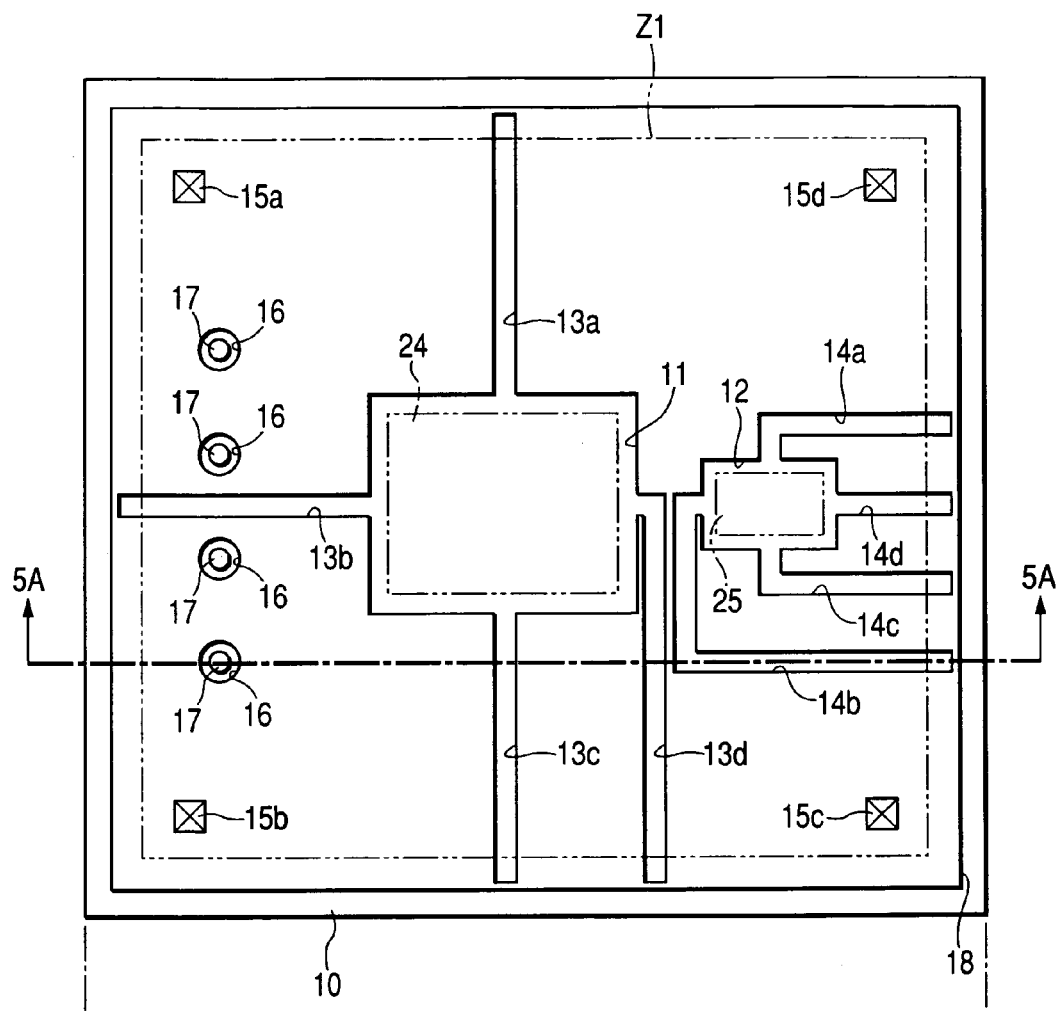
FIG. 5A is a plan view showing a support plate of the electronic device in accordance with the preferred embodiment of the present invention.
Figure 5B:
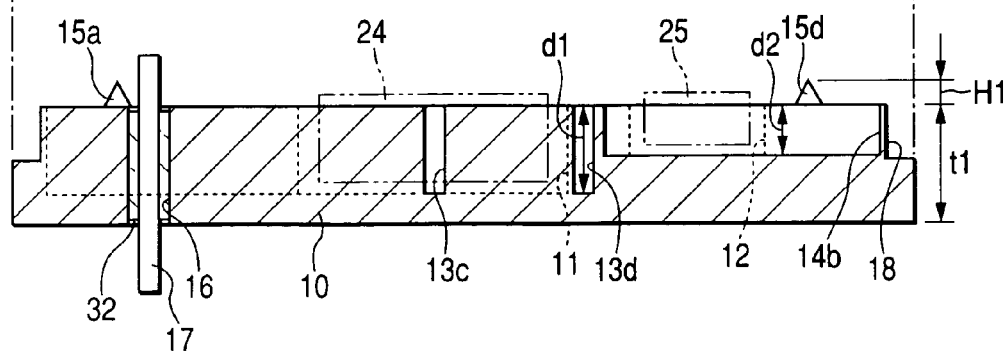
FIG. 5B is a vertical cross-sectional view showing the support plate in accordance with the preferred embodiment of the present invention, taken along a line 5A-5A of FIG. 5A.

FIGS. 5A and 5B show a detailed arrangement of the support plate (i.e. support base) 10. As understood from FIGS. 5A and 5B, the shape of the support plate 10 is rectangular. The thickness t1 of the support plate 10 is approximately 1.5 mm, preferably in the range from 0.5 mm to 2.0 mm, and more preferably in the range from 1.2 mm to 1.8 mm. The support plate 10 is made of a metallic member, such as iron.

Furthermore, the support plate 10 has a stepped portion 18 formed on the upper surface thereof along the outer periphery as shown in FIGS. 5A and 5B. The cover 31 is coupled with the stepped portion 18 (refer to FIGS. 1 and 2). Furthermore, the support plate 10 has recessed portions 11 and 12 formed on the upper surface thereof as shown in FIGS. 5A and 5B. The recessed portion 11 is capable of accommodating the electronic component 24 of FIG. 4. The recessed portion 12 is capable of accommodating the electronic component 25 of FIG. 4. More specifically, as shown in FIG. 2, in the condition that the circuit board (i.e. multilayered ceramic substrate) 20 is disposed on the support plate 10, the recessed portion 11 of the support plate 10 accommodates the electronic components 24 and the recessed portion 12 of the support plate 10 accommodates the electronic component 25. In this respect, the recessed portions 11 and 12 of the support plate 10 are slightly larger than the electronic components 24 and 25, respectively.

Furthermore, the rear surface (i.e. lower surface in FIG. 2) of the electronic component 24 and the bottom surface of the recessed portion 11 are bonded together with a solder 33. Similarly, the rear surface (i.e. lower surface in FIG. 2) of the electronic component 25 and the bottom surface of the recessed portion 12 are bonded together with a solder 34. The solders 33 and 34, serving as thermally conductive adhesive members, have the function of thermally bonding the rear surfaces of the electronic components 24 and 25 to the bottom surfaces of the recessed portions 11 and 12 of the support plate 10. These solders 33 and 34 are thermally adhesive materials.

Thus, as shown in FIG. 2, the circuit board 20 is disposed on the support plate 10 under the condition that the electronic components 24 and 25 mounted on the circuit board 20 are respectively accommodated in the recessed portions 11 and 12 of the support plate 10. The solders 33 and 34, serving as thermally conductive adhesive members (i.e. thermal adhesive members), interpose between the rear surfaces of the electronic components 24 and 25 and the bottom surfaces of the recessed portions 11 and 12 of the support plate 10. According to this arrangement, the heat generating from the electronic components 24 and 25 is transferred via the solders 33 and 34 to the support plate 10. Thus, an excellent heat radiation structure is realized.

Furthermore, as shown in FIGS. 5A and 5B, the support plate 10 has four through-holes 16 so that the external connecting terminals 17 can be inserted into these through-holes 16 so as to extend across the support plate 10. Each external connecting terminal 17 is sealed with a glass member 32 and fixed in the through-hole 16. More specifically, glass tubes (32) are respectively inserted into the through-holes 16 of the support plate 10 and the external connecting terminals 17 are assembled (i.e. inserted) into the glass tubes (32). In this condition, the above assembly is subjected to a heat treatment at 400° C. so that the glass tube (32) can melt into the glass member 32 in the clearance between the through-hole 16 and the external connecting terminal 17. Then, after finishing the heat treatment (i.e. after the temperature of the assembly has sufficiently decreased), respective external connecting terminals 17 are fixed together with the hardened glass members 32 in the through-holes 16 of the support plate 10. In this manner, the support plate 10 has the through-holes 16. The external connecting terminals 17 are integrally supported in these through-holes 16. And, the external connecting terminals 17 are insulated with the glass members 32 intervening between the through-holes 16 and the external connecting terminals 17.

As shown in FIGS. 5A and 5B, the support plate 10 has grooves 13a, 13b, 13c, and 13d formed on the upper surface thereof. These grooves 13a, 13b, 13c, and 13d respectively extend from the recessed portion 11 toward the periphery of the support plate 10 beyond the boundary of a layout region Z1 of the circuit board 20. More specifically, the recessed portion 11 has a rectangular shape with four straight sides in a plan view. The grooves 13a, 13b, 13c, and 13d respectively extend from these four sides of the rectangular recessed portion 11. Each of the grooves 13a, 13b, 13c, and 13d has a depth d1 which is identical with the depth of the recessed portion 11. For example, the depth d1 of these grooves 13a, 13b, 13c, and 13d is in the range from 0.25 mm to 1.0 mm.

Similarly, as shown in FIGS. 5A and 5B, the support plate 10 has grooves 14a, 14b, 14c, and 14d formed on the upper surface thereof. These grooves 14a, 14b, 14c, and 14d respectively extend from the recessed portion 12 toward the periphery of the support plate 10 beyond the boundary of the layout region Z1 of the circuit board 20. More specifically, the recessed portion 12 has a rectangular shape with four straight sides in a plan view. The grooves 14a, 14b, 14c, and 14d respectively extend from these four sides of the rectangular recessed portion 12. Each of the grooves 14a, 14b, 14c, and 14d has a depth d2 which is identical with the depth of the recessed portion 12. For example, the depth d2 of these grooves 14a, 14b, 14c, and 14d is in the range from 0.25 mm to 1.0 mm.

These grooves 13a-13d and 14a-14d arrange a communicating passage having one end opened to the inner spaces of the recessed portions 11 and 12 and the other end opened to the outside of the layout region Z1 of the circuit board 20, as shown in FIG. 3.

Furthermore, as shown in FIGS. 5A and 5B, the support plate 10 has raised portions 15a, 15b, 15c, and 15d formed at four corners on the upper surface thereof. Each of the raised portions 15a, 15b, 15c, and 15d has a quadrangular pyramid shape. The positions of these raised portions 15a, 15b, 15c, and 15d correspond to the four corners of the rectangular circuit board 20. These raised portions 15a, 15b, 15c, and 15d are identical with each other in both shape and size. The height H1 of respective raised portions 15a, 15b, 15c, and 15d is in the range from 0.1 mm to 0.5 mm. As shown in FIG. 2, the upper ends of these raised portions 15a, 15b, 15c, and 15d cooperatively support the circuit board 20. Thus, the raised portions 15a to 15d cooperatively support the circuit board 20 on the support plate 10 in a floated condition with a vertical gap corresponding to the height of these raised portions 15a to 15d.

As shown in FIG. 2, the upper end portion of the external connecting terminal 17 integrated with the support plate 10 is inserted in the recessed portion 27 of the circuit board 20 and bonded with a solder 29 (i.e. electrically conductive adhesive member). Furthermore, an adhesive material 30 is disposed between the support plate 10 and the circuit board 20.

For example, the adhesive material 30 is a resin-based adhesive, such as silicone-based adhesive which contains alumina powders as heat-conductive filler.

Next, the manufacturing method (namely, assembling method) of an electronic control unit (i.e. electronic device) will be explained with reference to FIGS. 6 to 11 and FIGS. 1 and 2. First of all, as shown in FIG. 6, the electronic components 24 and 25 are mounted on the circuit board 20 while the recessed portions 27 of the circuit board 20 are filled with the solder 29a. Furthermore, solders 33a and 34a are disposed on the bottom surfaces of the recessed portions 11 and 12 of the support plate 10 under the condition that the external connecting terminals 17 are integrated with the support plate 10. Regarding the positions of the solders 33a and 34a, it is possible to dispose the solders 33a and 34a on the rear surfaces of the electronic components 24 and 25, instead of disposing the solders 33a and 34a on the bottom surfaces of the recessed portions 11 and 12.

According to this embodiment, to improve the wettability of the solders 33a and 34a, an appropriate surface treatment is applied beforehand to the rear surfaces of the electronic components 24 and 25 and to the bottom surfaces of the recessed portions 11 and 12 of the support plate 10. More specifically, the rear surfaces of the electronic components 24 and 25 and the bottom surfaces of the recessed portions 11 and 12 of the support plate 10 are coated with vaporization films of copper (Cu).

Figure 7:
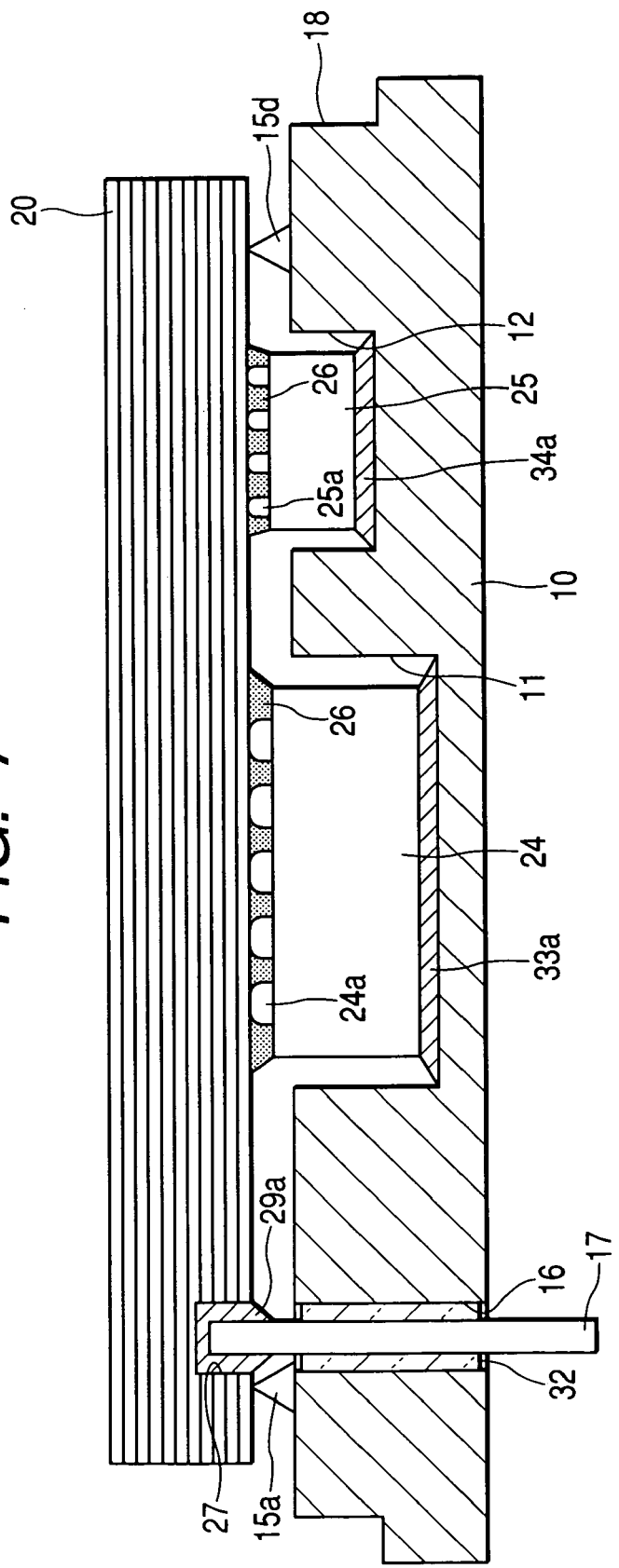
FIG. 7 is a vertical cross-sectional view explaining the assembling method of the electronic device in accordance with the preferred embodiment of the present invention.
Figure 8:
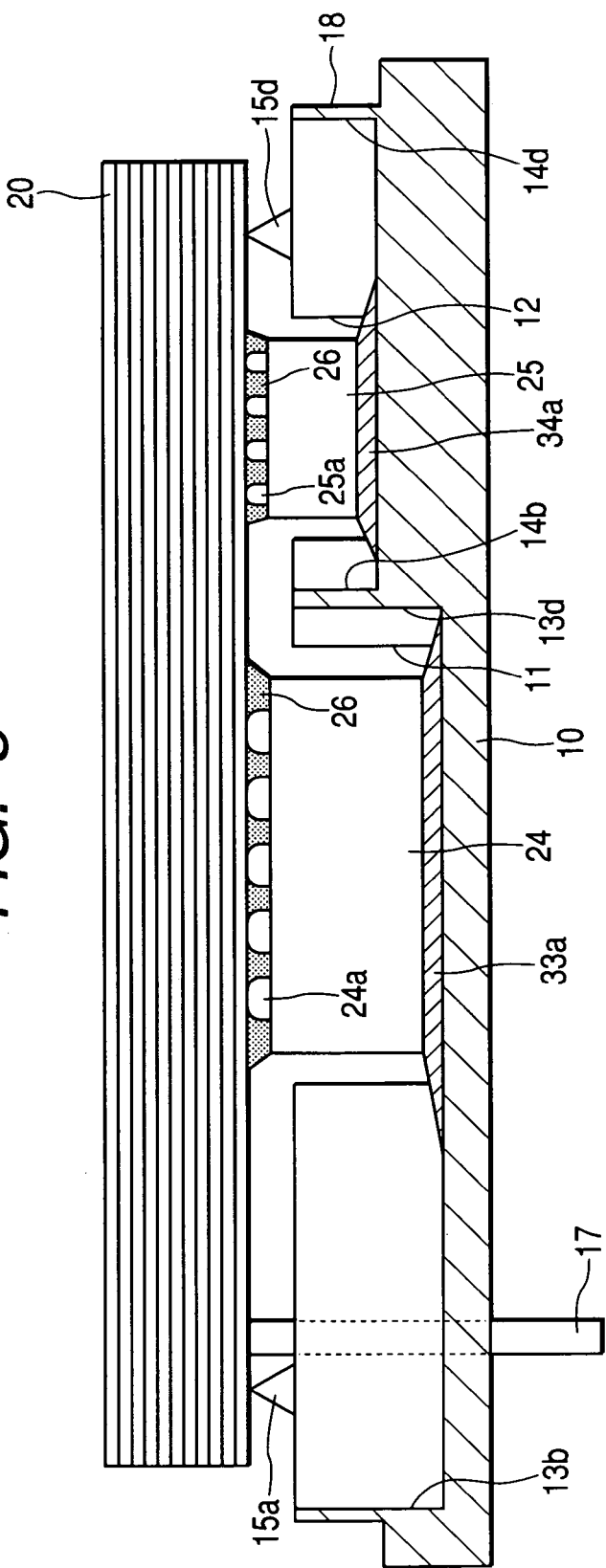
FIG. 8 is a vertical cross-sectional view explaining the assembling method of the electronic device in accordance with the preferred embodiment of the present invention.

Then, as shown in FIG. 7, the circuit board 20 is mounted on the support plate 10. In this case, the upper end portion of each external connecting terminal 17 is inserted into a corresponding recessed portion 27 of the circuit board 20. Furthermore, the raised portions 15a to 15d cooperatively support the circuit board 20 on the support plate 10 in a floated condition with a vertical gap corresponding to the height of these raised portions 15a to 15d. FIG. 8 is a vertical cross-section view showing the circuit board 20 mounted on the support plate 10, taken along a line 3A-3A of FIG. 3. The grooves 13a-13d and 14a-14d allow the surplus of solders 33a and 34a to go out of the recessed portions 11 and 12. The grooves 13a-13d and the recessed portion 11 have the same depth. Similarly, the grooves 14a-14d and the recessed portion 12 have the same depth. Thus, the surplus of solders 33a and 34a can easily go out of the recessed portions 11 and 12 via the grooves 13a-13d and 14a-14d. Furthermore, providing the grooves 13a-13d and 14a-14d so as to extend from the four sides of the respective recessed portions 11 and 12 is effective in allowing the surplus of solders 33a and 34a to smoothly go out of the recessed portions 11 and 12.

Figure 9:
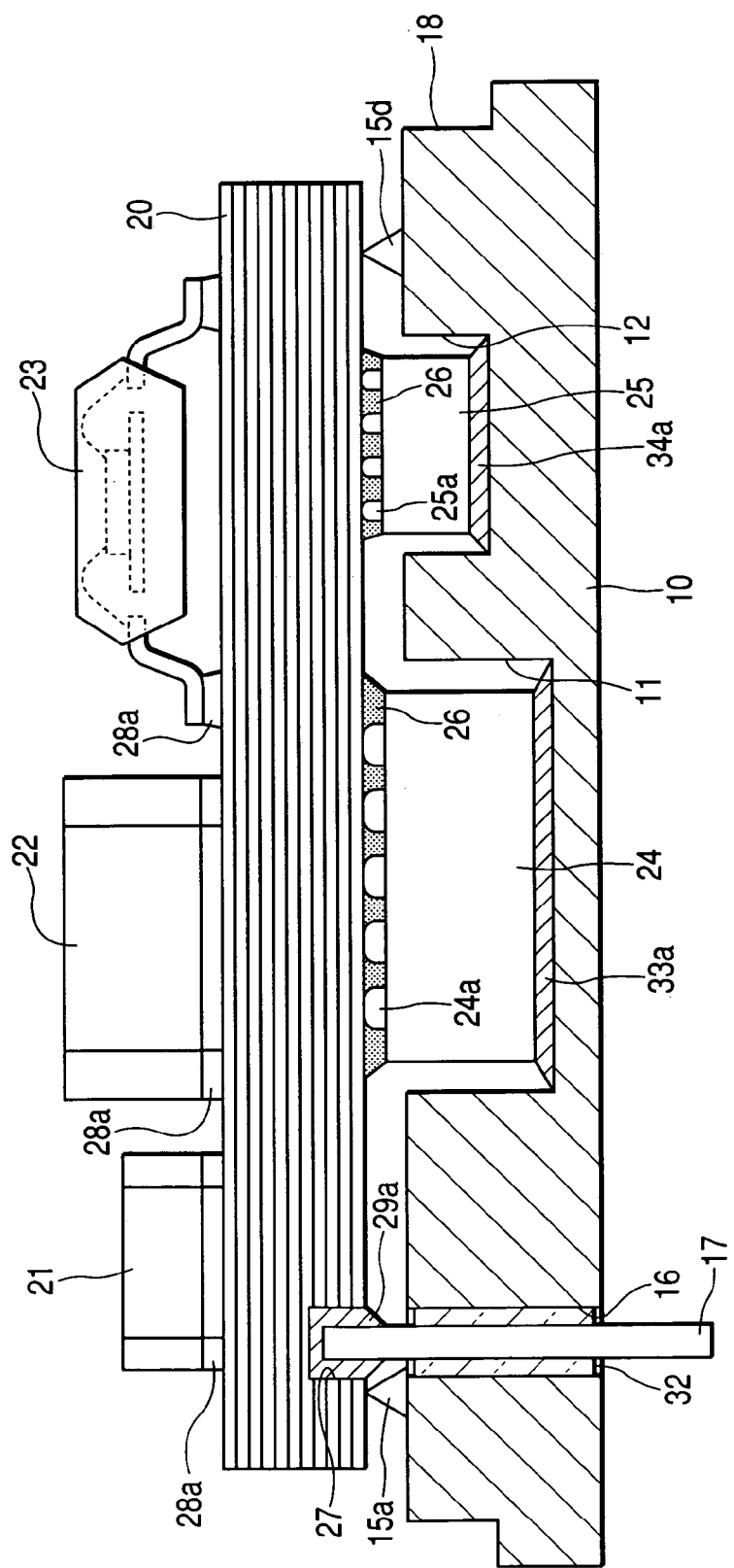
FIG. 9 is a vertical cross-sectional view explaining the assembling method of the electronic device in accordance with the preferred embodiment of the present invention.

Subsequently, as shown in FIG. 9, solders 28a are applied on the upper surface of the circuit board 20 to mount the electronic components 21, 22, and 23 thereon. In this condition, the raised portions 15a to 15d provided on the upper surface of the support plate 10 provide a degassing passage (i.e. a clearance) formed between the support plate 10 and the circuit board 20. As shown in FIG. 3, the grooves 13a-13d and 14a-14d provided on the support plate 10 have one ends opened to the inner spaces of the recessed portions 11 and 12 and the other ends opened to the outside of the layout region Z1 of the circuit board 20.

Figure 10:
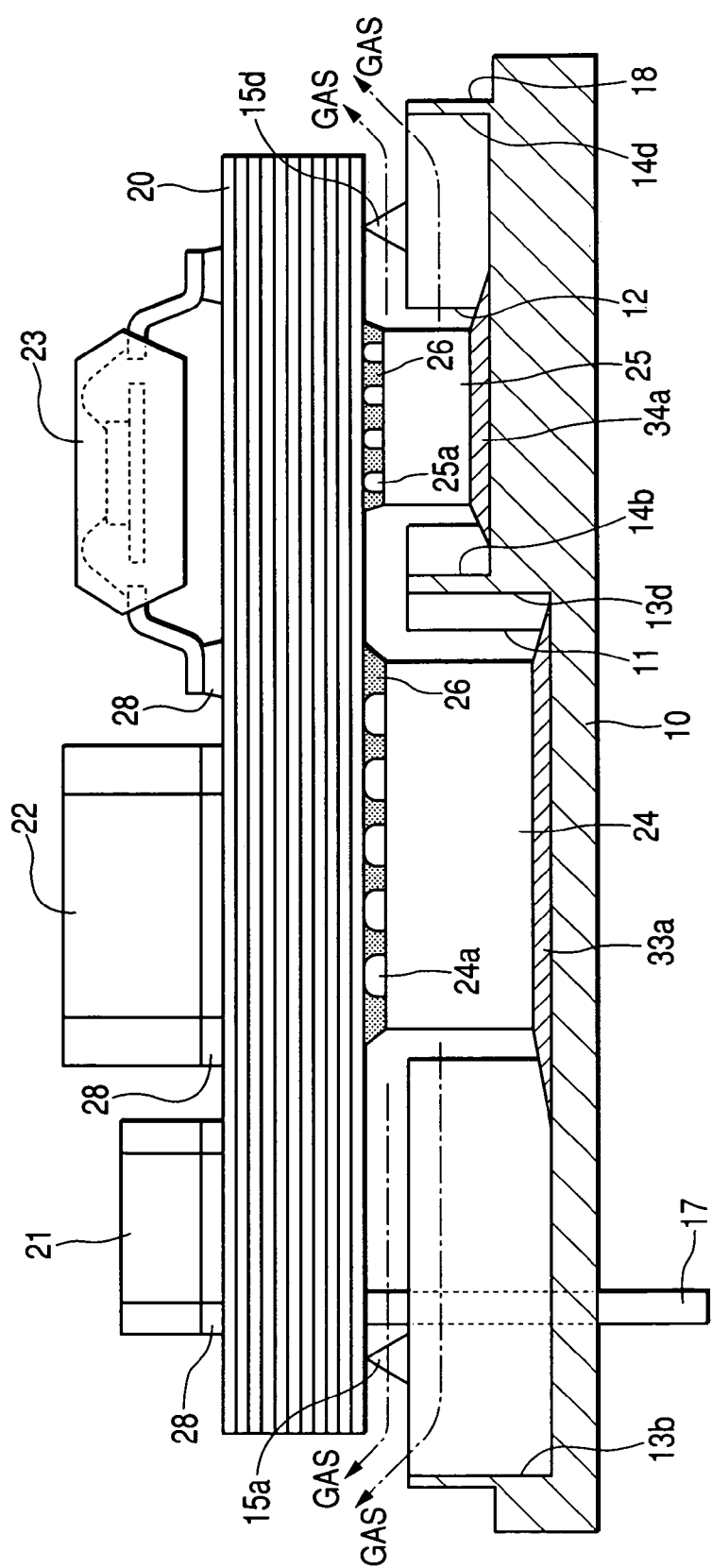
FIG. 10 is a vertical cross-sectional view explaining the assembling method of the electronic device in accordance with the preferred embodiment of the present invention.

Then, the assembly of the electric control unit shown in FIG. 9 is put in a solder reflow furnace and heated at the temperatures of 230° C. to 240° C. for 30 seconds to 60 seconds. According to this embodiment, bonding of the external connecting terminals 17 and the electronic components 21 to 25 onto the circuit board 20 can be accomplished at the same time. During this bonding operation, a significant amount of gas will generate from the solders 33a and 34a in the recessed portions 11 and 12 of the support plate 10, as shown in FIG. 10. However, the generated gas can move along the grooves 13a-13d and 14a-14d and the clearance kept by the raised portions 15a to 15d between the support plate 10 and the circuit board 20, and then go out of the assembled body of the electronic device.

Figure 11:
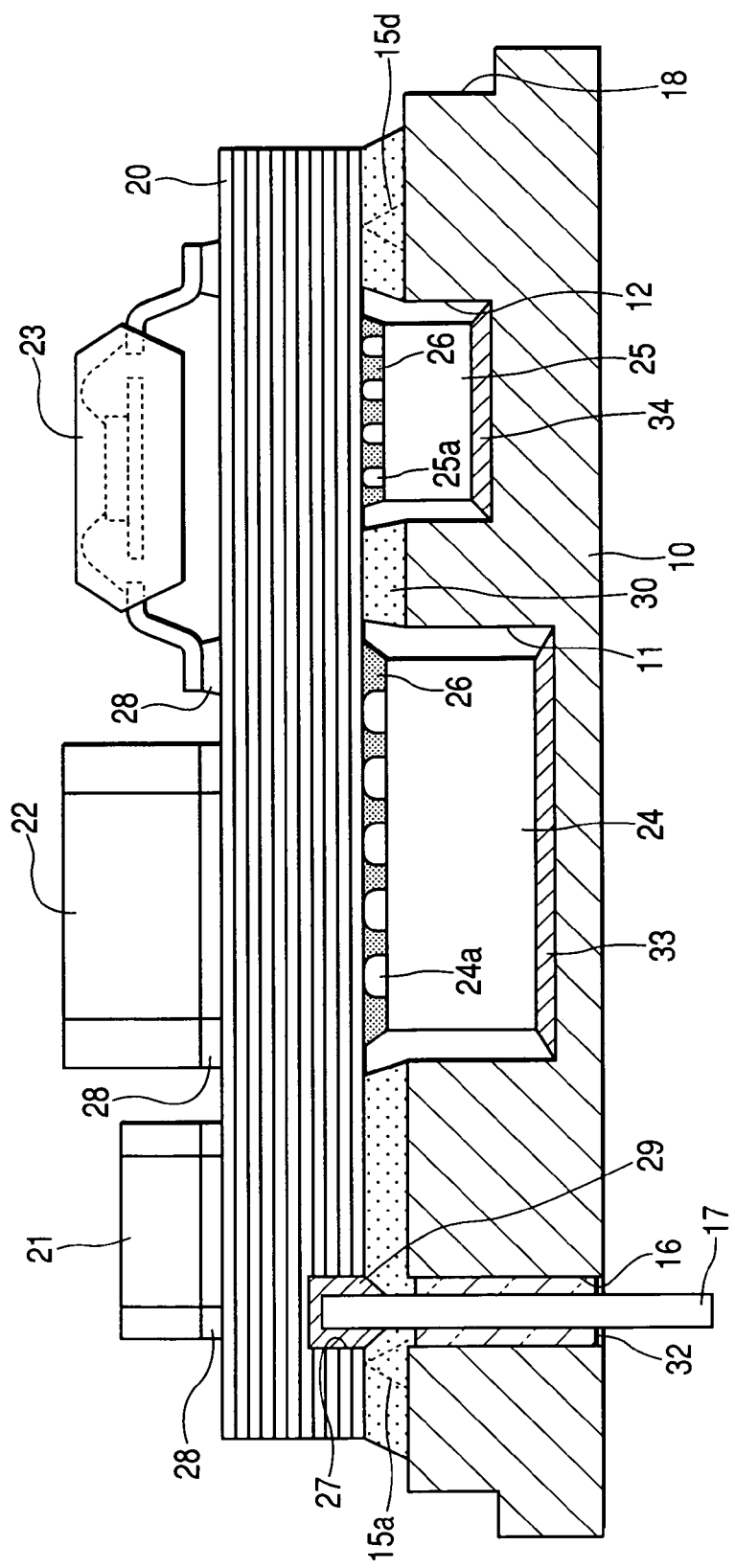
FIG. 11 is a vertical cross-sectional view explaining the assembling method of the electronic device in accordance with the preferred embodiment of the present invention.

Thereafter, as shown in FIG. 11, the adhesive material 30 (in a fluid state) is injected into the clearance between the support plate 10 and the circuit board 20. When the injected adhesive material 30 is hardened, the support plate 10 and the circuit board 20 are bonded firmly. According to this arrangement, the circuit board 20 can be sufficiently fixed to the support plate 10.

Finally, as shown in FIGS. 1 and 2, the cover 31 is coupled with the stepped portion 18 of the support plate 10 and bonded together. In this manner, in the process of assembling the electronic control unit (i.e. electric device), the above-described embodiment of the present invention includes the following steps for bonding the external connecting terminals 17, the electronic components 21 to 25, and the circuit board 20 to the support plate 10.

The step of applying the solder 29a (i.e. electric adhesive member) in respective recessed portions 27 of the circuit board 20 and disposing the solders 33a and 34a (i.e. thermal adhesive member) in the recessed portions 11 and 12 of the support plate 10 (first step).

The step of mounting the circuit board 20 on the support plate 10 (second step).

The step of applying the solders 28a (i.e. electric adhesive member) on the surface of the circuit board 20 and mounting the electronic components 21 to 23 on respective solders 28a (third step).

The step of simultaneously bonding the external connecting terminals 17, the electronic components 21 to 25, and the circuit board 20 (forth step).

The step of injecting the adhesive material 30 into the clearance between the support plate 10 and the circuit board 20 to sufficiently fix the support plate 10 and the circuit board 20 together (fifth step).

Accordingly, the number of required manufacturing steps can be reduced. It is advantageous in reducing the manufacturing costs. Furthermore, injecting/hardening the adhesive material 30 into the clearance between the support plate 10 and the circuit board 20 is effective in preventing foreign substances from entering inside the electronic device. Furthermore, injection of the adhesive material 30 is performed after accomplishing the process of melting/hardening the solders 28a, 29a, 33a, and 34a (i.e. electric and thermal adhesive member). Thus, there is no possibility that the adhesive material 30 undesirably mixes with the solders 28a, 29a, 33a, and 34a. Accordingly, these adhesive materials can exhibit their expected functions. Furthermore, the process of injecting/hardening the adhesive material 30 is performed after the simultaneous bonding process of the external connecting terminals 17, the electronic components 21 to 25, and the circuit board 20. This is effective in preventing foreign substances from entering inside the electronic device.

Furthermore, the gas generating from the solders 33a and 34a can easily go out of the recessed portions 11 and 12 via the degassing grooves 13a-13d and 14a-14d and the clearance kept by the raised portions 15a to 15d between the support plate 10 and the circuit board 20. This structure can eliminate or reduce the voids appearing in the bonding portion and accordingly can enhance the heat radiation properties. Furthermore, the degassing grooves 13a-13d and 14a-14d allow the surplus of solders 33a and 34a to go out of the recessed portions 11 and 12. Accordingly, this embodiment can provide a stable manufacturing method. Furthermore, the electronic control unit (circuit unit), i.e. electronic device, can be downsized. Furthermore, providing the raised portions 15a to 15d supporting the circuit board 20 in a floated condition is advantageous in that the circuit board 20 and the support plate 10 can be assembled in parallel to each other. Accordingly, this embodiment can provide a stable manufacturing method.

Furthermore, the support plate 10 is made of iron. Accordingly, the iron support plate 10 has a thermal expansion coefficient of approximately 12 ppm/° C., which is closer to the thermal expansion coefficient of the circuit board (alumina substrate) 20 (i.e. 7 ppm/° C.). For example, if the support plate (10) is made of aluminum whose thermal expansion coefficient is approximately 24 ppm/° C., there will be a large difference between the thermal expansion coefficients of the support plate (10) and the circuit board (alumina substrate) 20. Using the iron support plate 10 makes it possible to reduce the difference between the thermal expansion coefficients of the support plate 10 and the circuit board (alumina substrate) 20.

As apparent from the foregoing description, this embodiment has the following characteristic features.

(1) As shown in FIGS. 5A and 5B, the support plate 10 has degassing grooves (i.e. communicating passages) 13a-13d and 14a-14d provided on its surface, respective degassing grooves having one end opened to the inner spaces of the recessed portions 11 and 12 and the other end opened to the outside of the layout region Z1 of the circuit board 20. Furthermore, the support plate 10 has the raised portions 15a to 15d provided on its surface opposing to the circuit board 20. These raised portions 15a to 15d cooperatively support the circuit board 20 in a floated condition. As shown in FIG. 9, in the assembling process of the electronic control unit (i.e. electronic device), the electronic components 24 and 25 mounted on the circuit board 20 are accommodated in the recessed portions 11 and 12 of the support plate 10. And, the solders 33a and 34a (i.e. thermal adhesive member) disposed between the rear surfaces of the electronic components 24 and 25 and the bottom surfaces of the recessed portions 11 and 12 are heated and melted. During this heating and melting operation, the gas generating from the solders 33a and 34a can easily go out of the recessed portions 11 and 12 via the grooves (i.e. communicating passages) 13a-13d and 14a-14d provided on a surface of the support plate 10, as shown in FIG. 10. Accordingly, this arrangement can eliminate or reduce the voids remaining in the solders 33 and 34 and accordingly enhance the heat radiation properties. Furthermore, the raised portions 15a to 15d secure a space for the degassing passage extending between the support plate 10 and the circuit board 20. The gas generating from the solders 33a and 34a can go out of the recessed portions 11 and 12 via the degassing passage. Accordingly, this arrangement can also eliminate or reduce the voids remaining in the solders 33 and 34 and enhance the heat radiation properties.

In this manner, this embodiment can provide an electronic device (i.e. electronic control unit) capable of eliminating or reducing the voids remaining in the solders 33 and 34 in the manufacturing processes of accommodating the electronic components 24 and 25 mounted on the circuit board 20 in the recessed portions 11 and 12 of the support plate 10 and bonding the rear surfaces of the electronic components 24 and 25 to the bottom surfaces of the recessed portions 11 and 12 with the solders 33 and 34 (i.e. thermal adhesive member). Thus, this embodiment can provide an electronic device possessing excellent heat radiation properties. Furthermore, according to this embodiment, it is not necessary to use a support plate having a ceramic body with both surfaces coated with aluminum (which is disclosed in the above-described prior art document). Thus, the manufacturing costs can be reduced. The heat generated from the electronic components can be efficiently transferred to the support plate 10. Accordingly, an excellent heat radiation structure is realized.

(2) The communicating passage is the grooves 13a-13d and 14a-14d formed on a surface of the support plate 10 opposing to the circuit board 20. Thus, the communicating passage of this embodiment can be easily provided.

(3) The grooves 13a-13d and 14a-14d are identical in their depth with recessed portions 11 and 12. Therefore, the surplus of the solders 33a and 34a can easily move into these grooves from the recessed portions 11 and 12.

(4) The raised portions 15a to 15d have a pyramid shape respectively, and accordingly the raised portions 15a to 15d can eliminate or reduce the foreign particles or substances intervening between the sharp pinnacles of respective raised portions 15a to 15d and the circuit board 20. Therefore, the circuit board 20 can be accurately supported on the support plate 10 in a floated condition with a constant vertical gap corresponding to the height of these raised portions 15a to 15d.

(5) The support plate 10 shown in FIG. 2 is made of iron. According to this arrangement, it is possible to reduce the difference between thermal expansion coefficients of the support plate 10 and the circuit board 20. The stress acting on an electrode bonding portion at each external connecting terminal 17 can be reduced. The reliability of the electrode bonding portion can be enhanced against thermal shock.

(6) To improve the wettability of the solders 33a and 34a (i.e. thermal adhesive member), the surface treatment is applied beforehand to the rear surfaces of the electronic components 24 and 25 and to the bottom surfaces of the recessed portions 11 and 12 of the support plate 10. According to this arrangement, the electronic components 24 and 25 can be effectively bonded via the solders 33a and 34a mounted on the reverse surfaces thereof to the support plate 10. Thus, the stress acting on the electrode bonding portion (i.e. the bonding portions of the bumps 24a and 25a) of respective electronic components 24 and 25 can be reduced. The reliability of the electrode bonding portion can be enhanced against thermal shock. Furthermore, the surplus of solder can effectively move or expand.

(7) As shown in FIGS. 5A and 5B, the support plate 10 has the through-holes 16 and respective external connecting terminals 17 are integrated (i.e. supported and insulated) in these through-holes 16. Using the external connecting terminals 17 integrated with the support plate 10 is effective to simplify the process of bonding the external connecting terminals 17 to the circuit board 20. The manufacturing processes can be simplified and the manufacturing costs can be reduced.

(8) As shown in FIG. 4, the circuit board 20 has recessed portions 27 on a surface opposing to the support plate 10. As shown in FIG. 2, the protruding ends of respective external connecting terminal 17 are accommodated in these recessed portions 27. Furthermore, the external connecting terminals 17 are electrically connected to the recessed portions 27 with the solder 29 (i.e. electric adhesive member). Accordingly, when the size of respective recessed portion 27 formed on the circuit board 20 is sufficiently larger than the size of corresponding external connecting terminals 17, no accurate positioning is required for the external connecting terminals 17. The manufacturing processes can be simplified, and the manufacturing costs can be reduced.

(9) As shown in FIGS. 5A and 5B, the thick t1 of the support plate 10 is in the range from 0.5 mm to 2.0 mm. This assures a sufficient vibration-proof structure for the mounted electronic components.

(10) As shown in FIGS. 5A and 5B, the height H1 of the raised portions 15a to 15d is in the range from 0.1 mm to 0.5 mm. This assures a satisfactory heat radiation structure for allowing gas generating from the solders 33a and 34a (i.e. thermal adhesive member) can easily go out of the recessed portions.

(11) As shown in FIGS. 5A and 5B, the depths d1 and d2 of respective degassing grooves 13a-13d and 14a-14d are in the range from 0.25 mm to 1.0 mm. The surplus of the solders 33a and 34a can effectively move and expand. Thus, it becomes possible to provide a stable manufacturing method and improve the quality of a manufactured product.

(12) As shown in FIG. 4, the depth L1 of each recessed portion 27, which is formed on the bottom surface of the circuit board 20 for accommodating the upper end portion of the external connecting terminal 17, is in the range from 0.1 mm to 0.4 mm. This arrangement provides a large bonding area of the external connecting terminal 17, and reduces the stress acting to this bonding portion. The reliability of the bonding portion can be improves against thermal shock.

Hereinafter, various modified embodiments of the present invention will be explained.

Figure 12A:
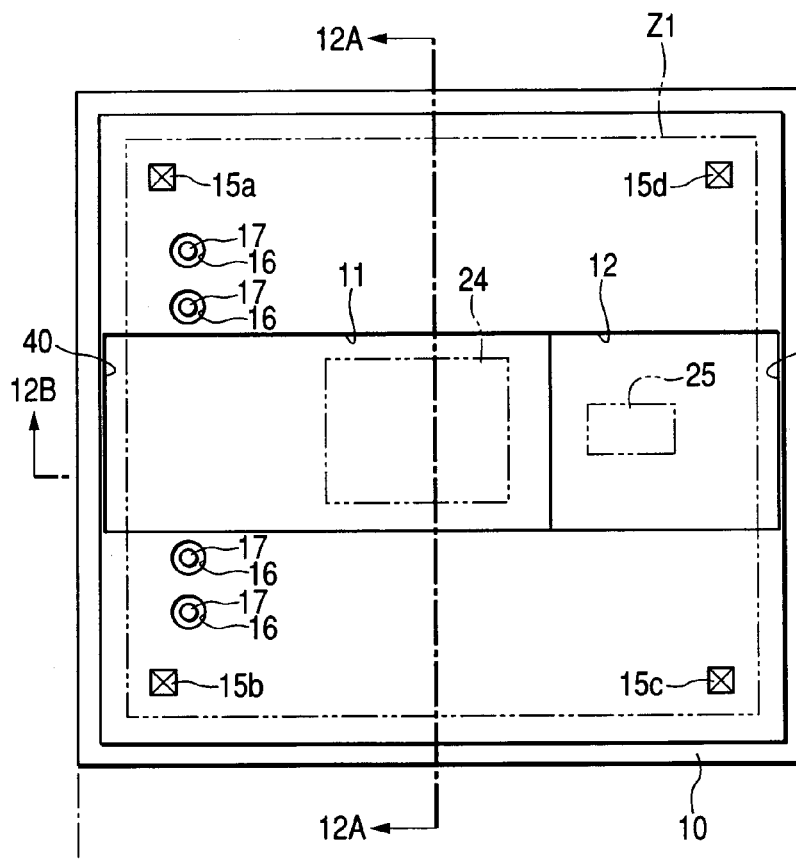
FIG. 12A is a plan view showing an electronic device in accordance with another embodiment of the present invention.
Figure 12B:
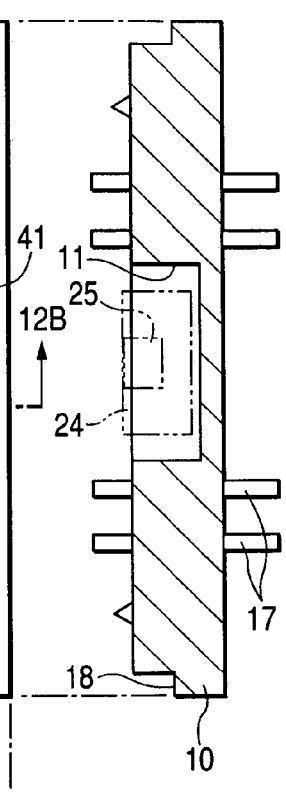
FIG. 12B is a vertical cross-sectional view showing the electronic device in accordance with another embodiment of the present invention, taken along a line 12A-12A of FIG. 12A.
Figure 12C:
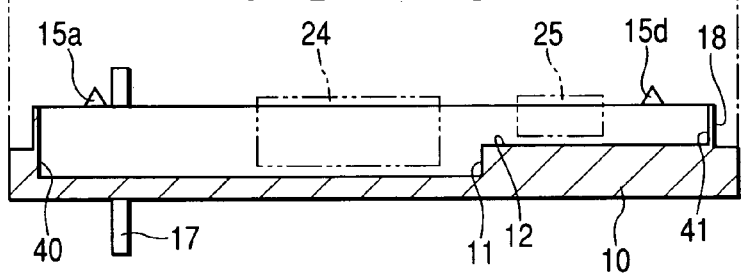
FIG. 12C is a vertical cross-sectional view showing the electronic device in accordance with another embodiment of the present invention, taken along a line 12B-12B of FIG. 12A.

The grooves 13a-13d and 14a-14d shown in FIGS. 5A and 5B can be replaced with grooves 40 and 41 shown in FIGS. 12A to 12C. In FIGS. 12A to 12C, the depth and the width of the degassing groove (communicating passage) 40 corresponding to the recessed portion 11 are identical with the depth and the width of the recessed portion 11. The depth and the width of the degassing groove (communicating passage) 41 corresponding to the recessed portion 12 are identical with the depth and the width of the recessed portion 12. Namely, the grooves 40 and 41 are formed so as to cover the region occupied by the electronic components 24 and 25. As the grooves 40 and 41 have the same depth and the same width as the recessed portions 11 and 12, the surplus of the solders 33a and 34a can easily move into the grooves 40 and 41. In FIGS. 12A to 12C, the width of the groove 40 (i.e. the width of the recessed portion 11) is identical with the width of the groove 41 (i.e. the width of the recessed portion 12). As the circuit board 20 is sufficiently fixed to the support plate 10, it is preferable that respective degassing grooves 40 and 41 have smaller areas.

Figure 13:
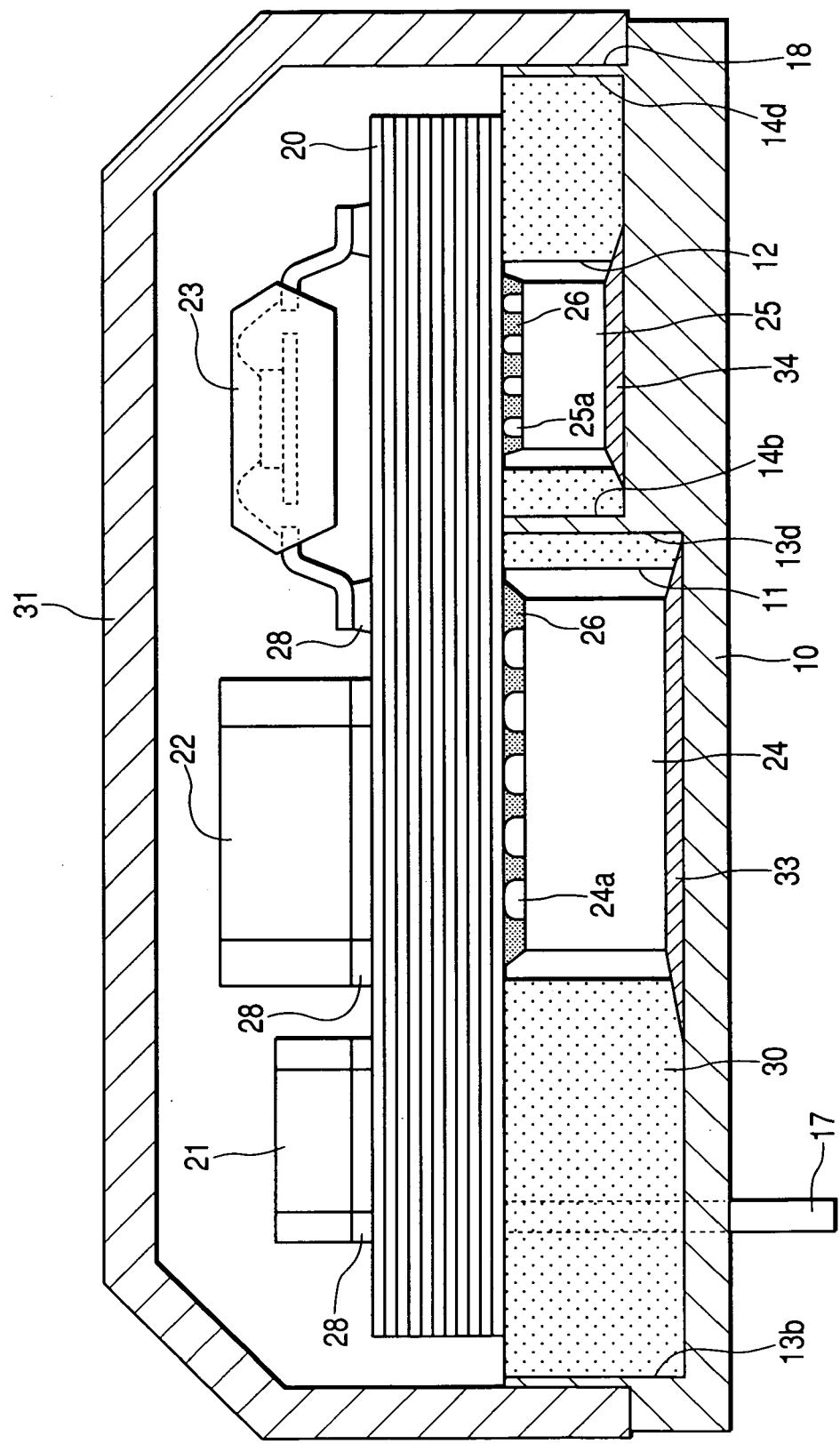
FIG. 13 is a vertical cross-sectional view showing an electronic device in accordance with another embodiment of the present invention.
Figure 14:
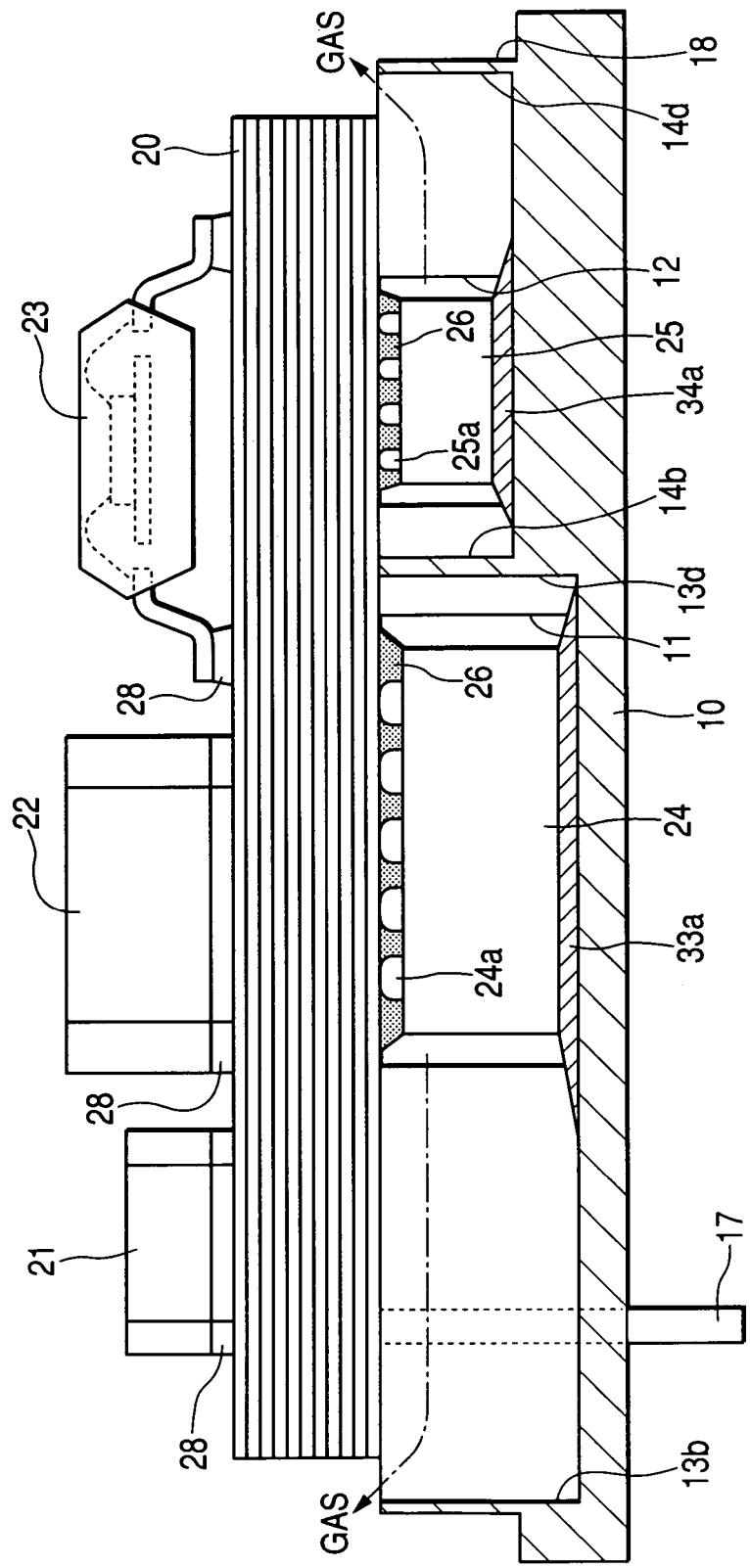
FIG. 14 is a vertical cross-sectional view explaining the assembling method of the electronic device shown in FIG. 13.

Furthermore, the arrangement shown in FIG. 1 can be replaced with an arrangement shown in FIG. 13. More specifically, instead of providing the raised portions 15a to 15d shown in FIG. 1, it is possible to directly place the circuit board 20 on the upper surface of the support plate 10 as shown in FIG. 13. In this case, as shown in FIG. 14, the gas generating from the solders 33a and 34a can easily go out of the recessed portions via the degassing grooves 13a-13d and 14a-14d during the assembling operations.

In this manner, the support plate 10 has the grooves (i.e. communicating passages) 13a-13d and 14a-14d provided on its surface, respectively having one end opened to the inner spaces of the recessed portions 11 and 12 and the other end opened to the outside of the layout region Z1 of the circuit board 20. Accordingly, in the assembling process of the electronic control unit (i.e. the electronic device), the electronic components 24 and 25 mounted on the circuit board 20 are accommodated in the recessed portions 11 and 12 of the support plate 10. And, the solders 33a and 34a (i.e. thermal adhesive member) disposed between the rear surfaces of the electronic components 24 and 25 and the bottom surfaces of the recessed portions 11 and 12 are heated and melted. During this heating and melting operation, the gas generating from the solders 33a and 34a can easily go out of the recessed portions 11 and 12 via the grooves (i.e. communicating passages) 13a-13d and 14a-14d provided on a surface of the support plate 10. Accordingly, this arrangement can eliminate or reduce the voids remaining in the solders 33 and 34 and accordingly enhance the heat radiation properties.

Figure 15:
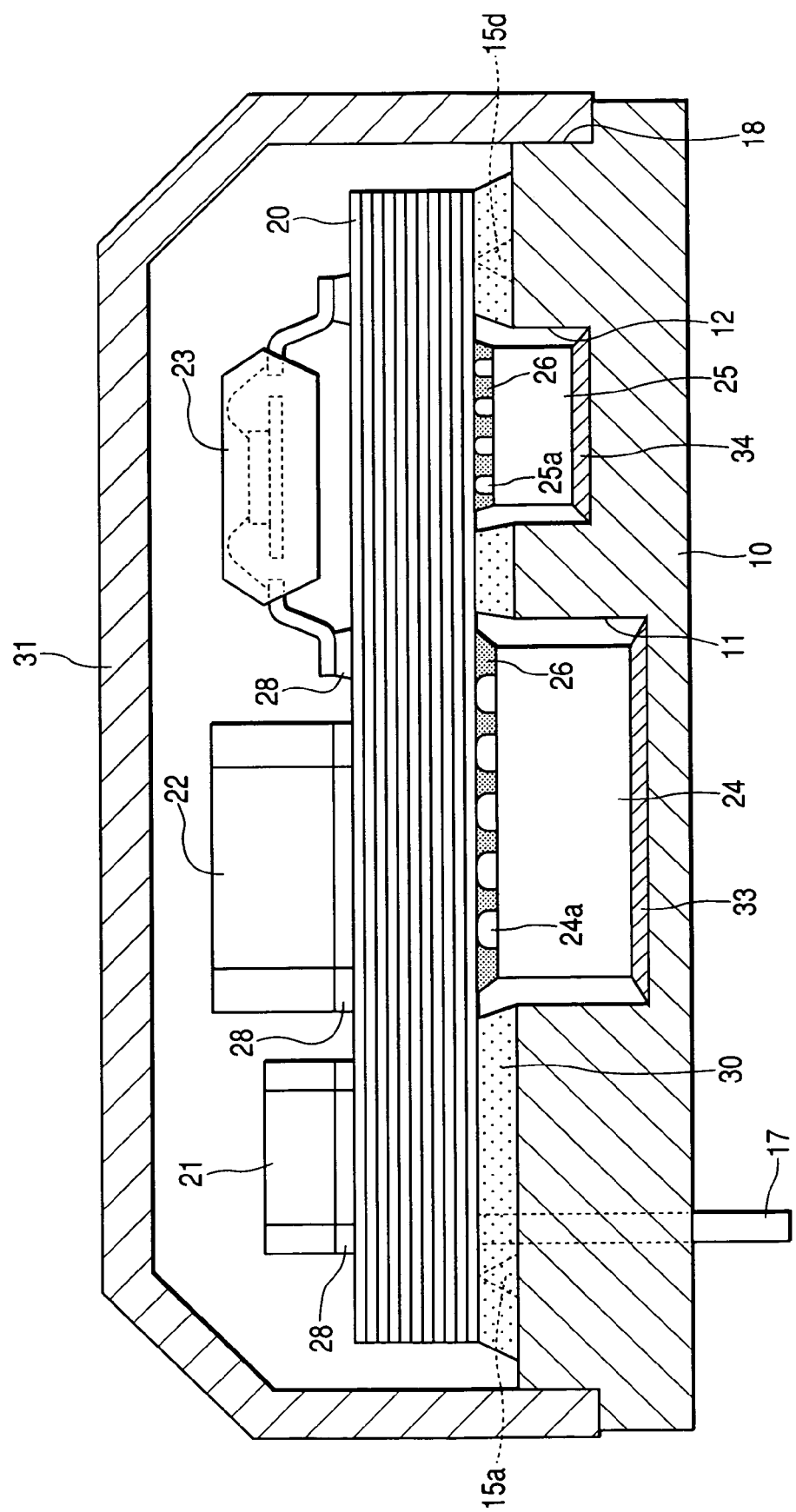
FIG. 15 is a vertical cross-sectional view showing an electronic device in accordance with another embodiment of the present invention.
Figure 16:
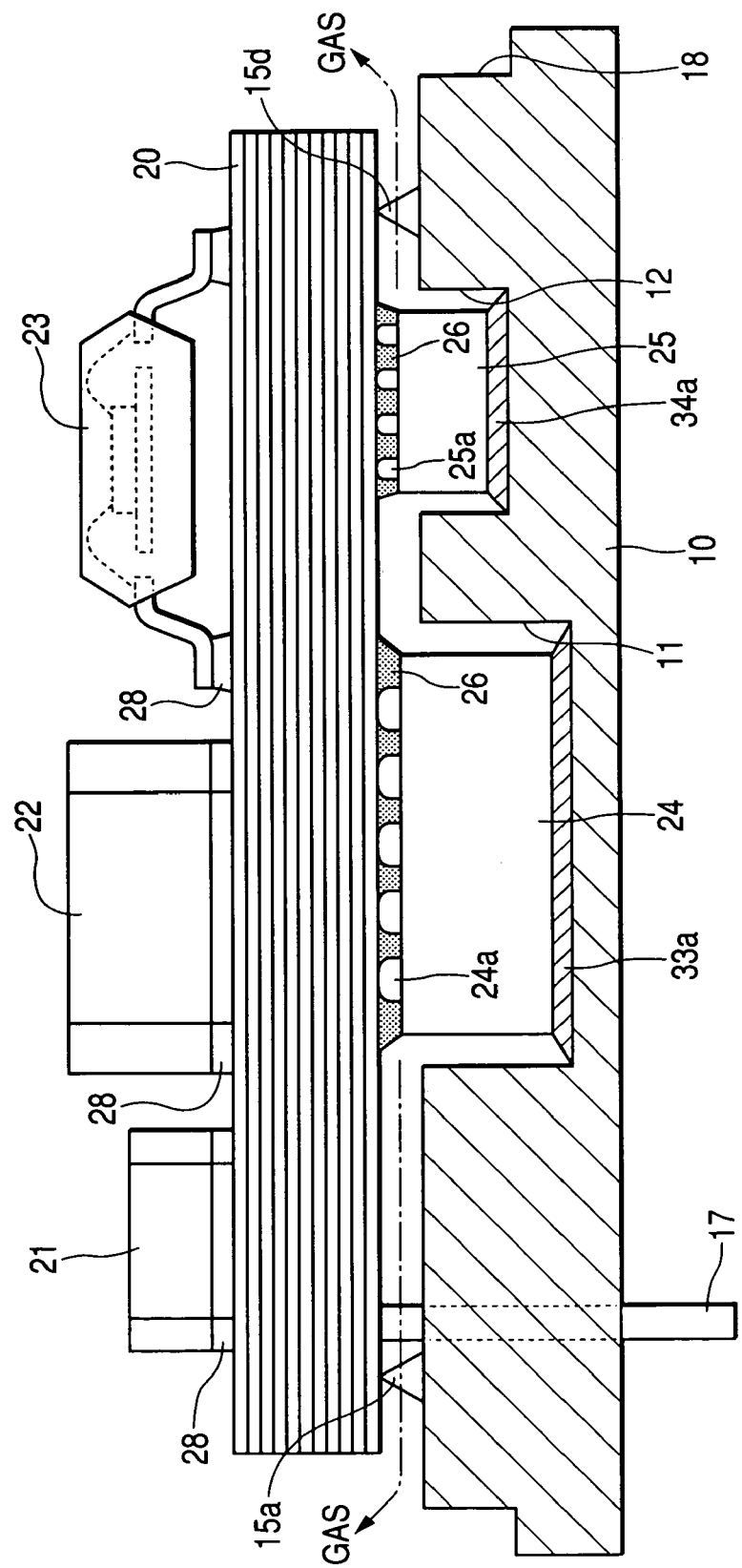
FIG. 16 is a vertical cross-sectional view explaining the assembling method of the electronic device shown in FIG. 15.

Furthermore, the arrangement shown in FIG. 1 can be replaced with an arrangement shown in FIG. 15. More specifically, instead of providing the degassing grooves 13a-13d and 14a-14d shown in FIG. 1, it is possible to support the circuit board 20 on the upper surface of the support plate 10 with the raised portions 15a to 15d in a floated condition as shown in FIG. 15. In this case, as shown in FIG. 16, the gas generating from the solders 33a and 34a during the assembling operations can easily go out of the recessed portions via the space (clearance) kept by the raised portions 15a to 15d between the support plate 10 and the circuit board 20.

In this manner, the support plate 10 has the raised portions 15a, 15b, 15c, and 15d provided on its surface opposing to the circuit board 20 to support the circuit board 20 in a floated condition. Accordingly, in the assembling process of the electronic control unit (i.e. the electronic device), the electronic components 24 and 25 mounted on the circuit board 20 are accommodated in the recessed portions 11 and 12 of the support plate 10. And, the solders 33a and 34a (i.e. thermal adhesive member) disposed between the rear surfaces of the electronic components 24 and 25 and the bottom surfaces of the recessed portions 11 and 12 are heated and melted. During this heating and melting operation, the gas generating from the solders 33a and 34a can easily go out of the recessed portions 11 and 12 via the degassing passage formed by the raised portions 15a to 15d between the support plate 10 and the circuit board 20. This arrangement can eliminate or reduce the voids remaining in the solders 33 and 34 and accordingly enhance the heat radiation properties.

Furthermore, it is possible to replace the degassing grooves 13a-13d and 14a-14d with through-holes (i.e. communicating holes) respectively having one end opened to the inner spaces of the recessed portions 11 and 12 and the other end opened to the outside of the layout region Z1 of the circuit board 20.

Furthermore, the shape of the raised portions 15a to 15d is not limited to a quadrangular pyramid shape. Accordingly, the raised portions 15a to 15d can be configured into any other type of pyramid, or circular cone, or circular cylinder. The number of the raised portions 15a to 15d is not limited to four corresponding to respective corners of the rectangular circuit board 20.

Furthermore, instead of using the solders 28, 29, 33, and 34, it is possible to use an electrically conductive adhesive material (so-called Ag paste) as electric and thermal adhesive member. Furthermore, a silicon-group thermal conductive gel can be used as thermal adhesive member intervening between the rear surfaces of the electronic components 24 and 25 and the bottom surfaces of the recessed portions 11 and 12 of the support plate 10. More specifically, in FIG. 2, the solder or the electrically conductive adhesive material can be used as the members indicated by reference numerals 28 and 29, and the silicon-group thermal conductivity gel can be used as the members indicated by reference numerals 33 and 34. In short, it is preferable to place the excellent thermal conductive material between the rear surfaces of the electronic components 24 and 25 and the bottom surfaces of the recessed portions 11 and 12 of the support plate 10. In general, if the electronic device is subjected to the high-temperature environment exceeding 100° C., the gas (such as steam) will generate from the gel and stay in the form of voids. Using the silicon-group thermal conductivity gel is advantageous in effectively removing such a residual gas.

In this manner, according to the present invention, the gas generating from the recessed portion 11 of the support plate 10 can easily go out of the recessed portion 11 via the communicating passages (13a-13a, 14a-14d) provided on the surface of the support plate 10, or via the degassing passage provided by the raised portions 15a to 15d between the support plate 10 and the circuit board 20. Thus, the arrangement according to the present invention can eliminate or reduce the voids remaining in the solders and accordingly enhance the heat radiation properties.

As apparent from the foregoing description, the present invention provides a first electronic device including the circuit board 20 disposed on the support plate 10, with at least one electronic component 24 or 25 mounted on the circuit board 20 being accommodated in the recessed portion 11 or 12 of the support plate 10. The thermal adhesive member 33 or 34 intervenes between the rear surface of the electronic component 24 or 25 and the bottom surface of the recessed portion 11 or 12 of the support plate 10. The support plate 10 of the first electronic device has the communicating passage 13a-13d or 14a-14d having one end opened to the inner space of the recessed portion 11 or 12 and the other end opened to the outside of the layout region Z1 of the circuit board 20.

Furthermore, the present invention provides a second electronic device including the circuit board 20 disposed on the support plate 10, with at least one electronic component 24 or 25 mounted on the circuit board 20 being accommodated in a recessed portion 11 or 12 of the support plate 10. The thermal adhesive member 33 or 34 intervenes between the rear surface of the electronic component 24 or 25 and the bottom surface of the recessed portion 11 or 12 of the support plate 10. The support plate 10 of the second electronic device has the raised portions 15a to 15d on its surface opposing to the circuit board 20 for supporting the circuit board 20 in a floated condition with a gap corresponding to the height of these raised portions 15a to 15d between the support plate 10 and the circuit board 20.

Moreover, the present invention provides a third electronic device including the circuit board 20 disposed on the support plate 10, with at least one electronic component 24 or 25 mounted on the circuit board 20 being accommodated in the recessed portion 11 or 12 of the support plate 10. The thermal adhesive member 33 or 34 intervenes between the rear surface of the electronic component 24 or 25 and the bottom surface of the recessed portion 11 or 12 of the support plate 10. The support plate 10 of the third electronic device has the communicating passage 13a-13d and 14a-14d having one end opened to the inner space of the recessed portion 11 or 12 and the other end opened to the outside of the layout region Z1 of the circuit board. Furthermore, the support plate 10 has the raised portions 15a to 15d on its surface opposing to the circuit board 20 for supporting the circuit board 20 in a floated condition with a gap corresponding to the height of these raised portions 15a to 15d between the support plate 10 and the circuit board 20.

What is claimed is:

1. An electronic device comprising:
  a circuit board on which at least one electronic component is mounted;
  a support plate supporting the circuit board and having one surface, the one surface facing the circuit board, the one surface having a principal surface, the one surface being formed with at least one recessed portion recessed relative to the principal surface to accommodate the electronic component of the circuit board, the one surface having at least three raised portions formed thereon and raised relative to the principal surface and held in direct contact with a surface of the circuit board; and
  a thermal adhesive member intervening between a rear surface of said electronic component and a bottom surface of the recessed portion of said support plate;
  wherein the raised portions of the support plate have heights to allow the electronic component and the thermal adhesive member to be received between the surface of the circuit board and the bottom surface of the recessed portion of said support plate,
  wherein:
  the support plate further has a communicating passage extending from the recessed portion to an end portion of the circuit board placed in the face-to-face relationship with the support plate in a layout to allow an opening portion contiguous with the communicating passage to be exposed under a status where the circuit board is placed on the support plate in the face-to-face relationship therewith, and
  the communicating passage is a groove formed on the one surface of the support plate.

2. An electronic device comprising:
  a circuit board on which at least one electronic component is mounted;
  a support plate supporting the circuit board and having one surface, the one surface facing the circuit board, the one surface having a principal surface, the one surface being formed with at least one recessed portion recessed relative to the principal surface to accommodate the electronic component of the circuit board, the one surface having at least three raised portions formed thereon and raised relative to the principal surface and held in direct contact with a surface of the circuit board; and
  a thermal adhesive member intervening between a rear surface of said electronic component and a bottom surface of the recessed portion of said support plate;
  wherein the raised portions of the support plate have heights to allow the electronic component and the thermal adhesive member to be received between the surface of the circuit board and the bottom surface of the recessed portion of said support plate,
  wherein:
  the support plate further has a communicating passage extending from the recessed portion to an end portion of the circuit board placed in the face-to-face relationship with the support plate in a layout to allow an opening portion contiguous with the communicating passage to be exposed under a status where the circuit board is placed on the support plate in the face-to-face relationship therewith, and the communicating passage includes a plurality of passages starting from the recessed portion of said support plate and extending in plural directions.

3. An electronic device comprising:

a circuit board on which at least one electronic component is mounted;

a support plate supporting the circuit board and having one surface, the one surface facing the circuit board, the one surface having a principal surface, the one surface being formed with at least one recessed portion recessed relative to the principal surface to accommodate the electronic component of the circuit board, the one surface having at least three raised portions formed thereon and raised relative to the principal surface and held in direct contact with a surface of the circuit board; and a thermal adhesive member intervening between a rear surface of said electronic component and a bottom surface of the recessed portion of said support plate;

wherein the raised portions of tbe support plate have heights to allow the electronic component and the thermal adhesive member to be received between the surface of the circuit board and the bottom surface of the recessed portion of said support plate, wherein:

the support plate further has a communicating passage extending from the recessed portion to an end portion of the circuit board placed in the face-to-face relationship with the support plate in a layout to allow an opening portion contiguous with the communicating passage to be exposed under a status where the circuit board is placed on the support plate in the face-to-face relationship therewith, and the communicating passage includes a plurality of passages starting from sidewalls of the recessed portion of said support plate and extending in given orientations, respectively.

4. An electronic device comprising:

a circuit board on which at least one electronic component is mounted;

a support plate supporting the circuit board and having one surface, the one surface facing the circuit board, the one surface having a principal surface, the one surface being formed with at least one recessed portion recessed relative to the principal surface to accommodate the electronic component of the circuit board, the one surface having at least three raised portions formed thereon and raised relative to the principal surface and held in direct contact with a surface of the circuit board; and a thermal adhesive member intervening between a rear surface of said electronic component and a bottom surface of the recessed portion of said support plate;

wherein the raised portions of the support plate have heights to allow the electronic component and the thermal adhesive member to be received between the surface of the circuit board and the bottom surface of the recessed portion of said support plate, wherein:

the support plate further has a communicating passage extending from the recessed portion to an end portion of the circuit board placed in the face-to-face relationship with the support plate in a layout to allow an opening portion contiguous with the communicating passage to be exposed under a status where the circuit board is placed on the support plate in the face-to-face relationship therewith, and the communicating passage is formed in a zonal pattern with a width embracing the recessed portion of said support plate.

5. An electronic device comprising:

a circuit board having one surface on which at least one electronic component is mounted;

a support plate supporting the circuit board and having one surface, the one surface of the, support plate facing the circuit board, the one surface having a principal surface, the one surface of the support plate being formed with at least one recessed portion recessed relative to the principal surface to accommodate the at least one electronic component of the circuit board, the one surface of the support plate having at least three raised portions formed thereon and raised relative to the principal surface and held in direct contact with the one surface of the circuit substrate; and a thermal adhesive member intervening between a rear surface of said electronic component and a bottom surface of the recessed portion of said support plate, wherein, said at least three raised portions of the support plate support said circuit board a floated condition with a gap corresponding to the height of said raised portions between said support plate and said circuit board to allow the at least one electronic component and the thermal adhesive member to be received between the one surface of the circuit board and the bottom surface of the recessed portion of said support plate, wherein:

the support plate also has a communicating passage extending from the recessed portion to an end portion of the circuit board placed in a face-to-face relationship with the support plate in a layout to allow an opening portion contiguous with the communicating passage to be exposed under a status where the circuit board is placed on the support plate in the face-to-face relationship therewith.

6. The electronic device according to claim 5, wherein:

the communicating passage includes a plurality of passages starting from the recessed portion of said support plate and extending in plural directions.

7. The electronic device according to claim 5, wherein:

the communicating passage includes a plurality of passages starting from sidewalls of the recessed portion of said support plate and extending in given orientations, respectively.

8. The electronic device according to claim 5, wherein:

the communicating passage is formed in a zonal pattern with a width embracing the recessed portion of said support plate.

9. The electronic device in accordance with claim 5, wherein said communicating passage is a groove formed on the one surface of said support plate.

10. The electronic device of claim 5, wherein the end portion is a surface of the support plate adjacent to a periphery of the one surface, the end portion being not between the circuit board and the support plate, wherein the communicating passage has a depth identical to a depth of the recessed portion.

* * * * *